United States Patent [19]

Etchison, Jr. et al.

[11] 4,038,696
[45] July 26, 1977

[54] STRUCTURE FOR PROVIDING SUPPORT FOR CIRCUIT PLUG-IN UNITS, CONNECTORS AND RELATED WIRING

[75] Inventors: John Orrell Etchison, Jr., Clemmons; Garland Ralph Jobe; Robert Henry Wellons Jones, Jr., both of Greensboro, all of N.C.

[73] Assignees: Western Electric Company, Inc., New York, N.Y.; Bell Telephone Laboratories, Incorporated, Murray Hill, N.J.

[21] Appl. No.: 656,213

[22] Filed: Feb. 9, 1976

[51] Int. Cl.² .............................................. H02B 1/02
[52] U.S. Cl. .................................................. 361/415
[58] Field of Search .................. 317/101 DH, 99, 122, 317/120; 211/41; 248/27.1, 27.3; 179/98

[56] References Cited

U.S. PATENT DOCUMENTS

| 3,368,780 | 2/1968 | Buttriss | 317/101 DH |
| 3,904,937 | 9/1975 | Levin | 317/101 DH |

FOREIGN PATENT DOCUMENTS

| 1,340,580 | 12/1973 | United Kingdom | 317/101 DH |

Primary Examiner—David Smith, Jr.
Attorney, Agent, or Firm—J. B. Hoofnagle, Jr.

[57] ABSTRACT

A shelf for supporting an electronic circuit module is formed from sheet metal and is provided with a plurality of tabs which define spaced, module-receiving channels on two major opposite surfaces thereof. Flanged side portions of the shelf provide for the securing of spaced shelves to a frame to provide upper and lower aligned support for a plurality of the circuit modules.

A back plate is also formed from sheet metal and is provided with bendable tabs for receiving and supporting a plurality of spaced connectors. Each connector is provided on one side thereof with a receptacle for terminations of a printed circuit board and with interconnected terminal pins extending from the opposite thereof. The terminal pins can be prewired to an electrical plug for subsequent connection to a mating electrical plug and, thereby, to an external circuit.

The back plate is secured to the frame in alignment with the channels on the shelf so that circuit modules inserted into the channels have printed circuit terminations which are inserted into the receptacle of an associated one of the connectors.

18 Claims, 23 Drawing Figures

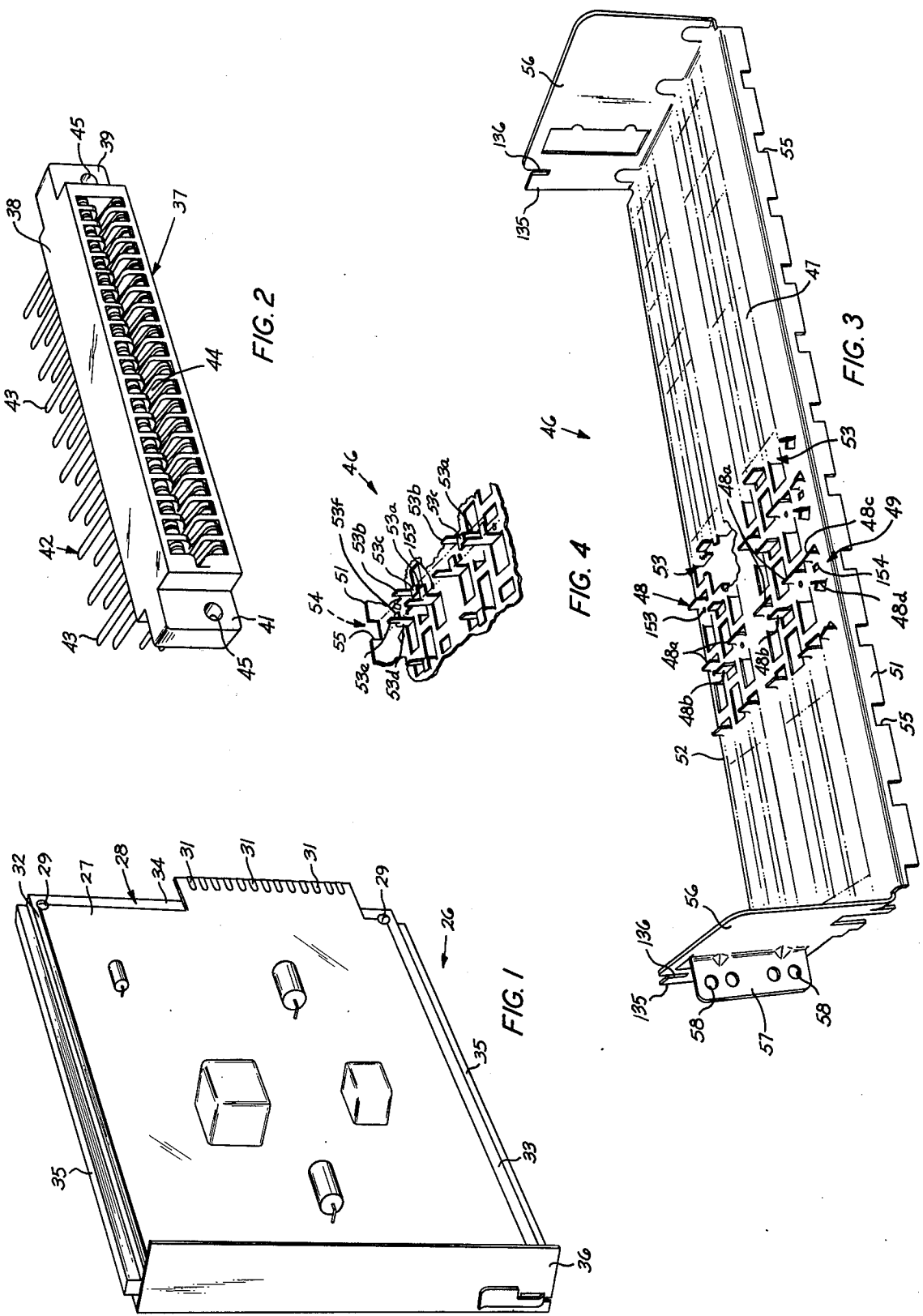

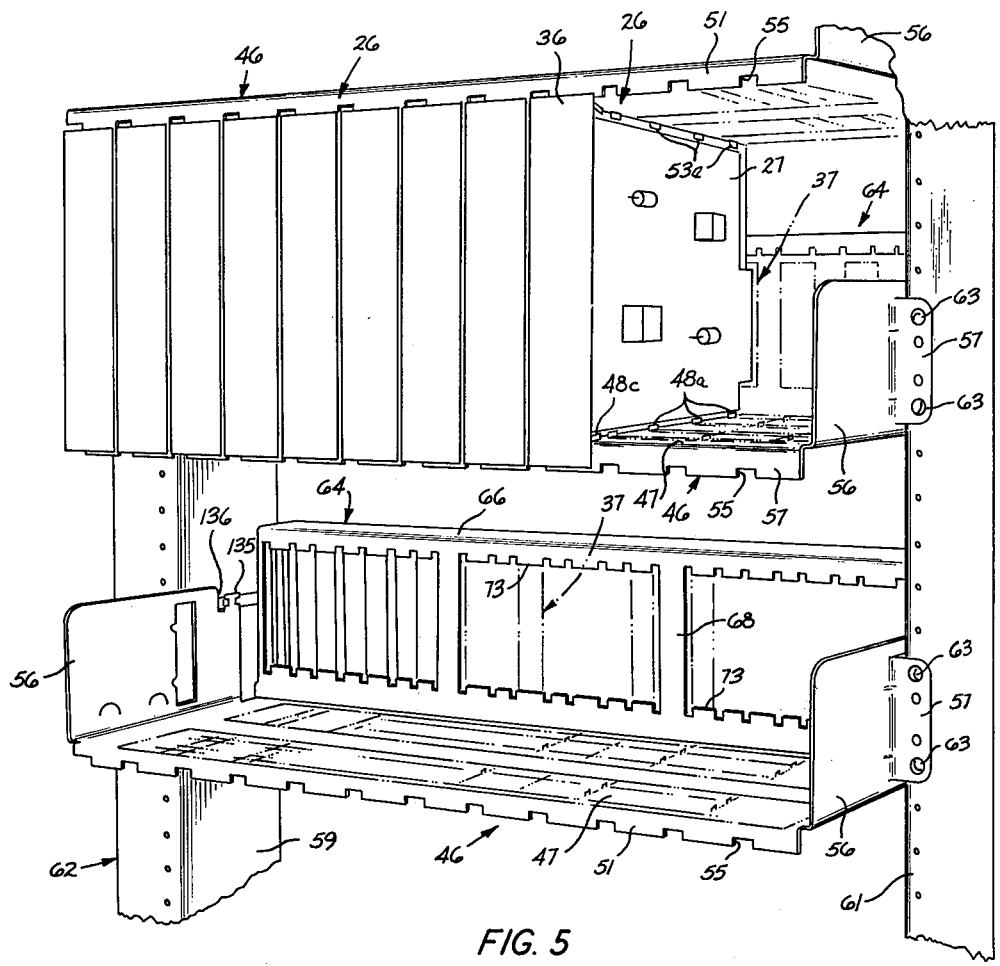
FIG. 5
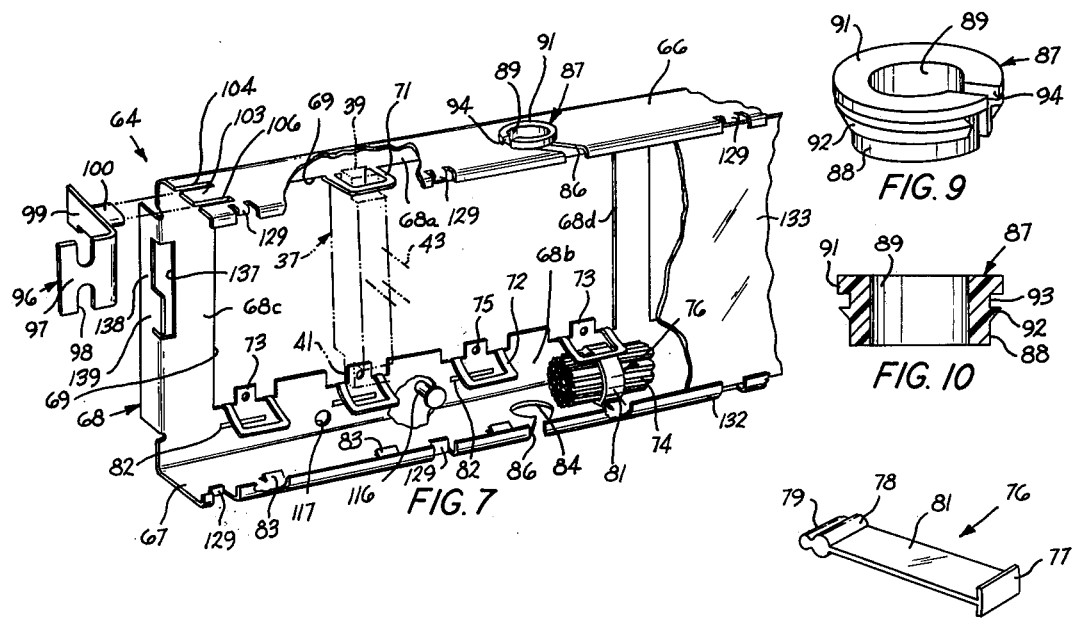
FIG. 7
FIG. 9
FIG. 10
FIG. 8

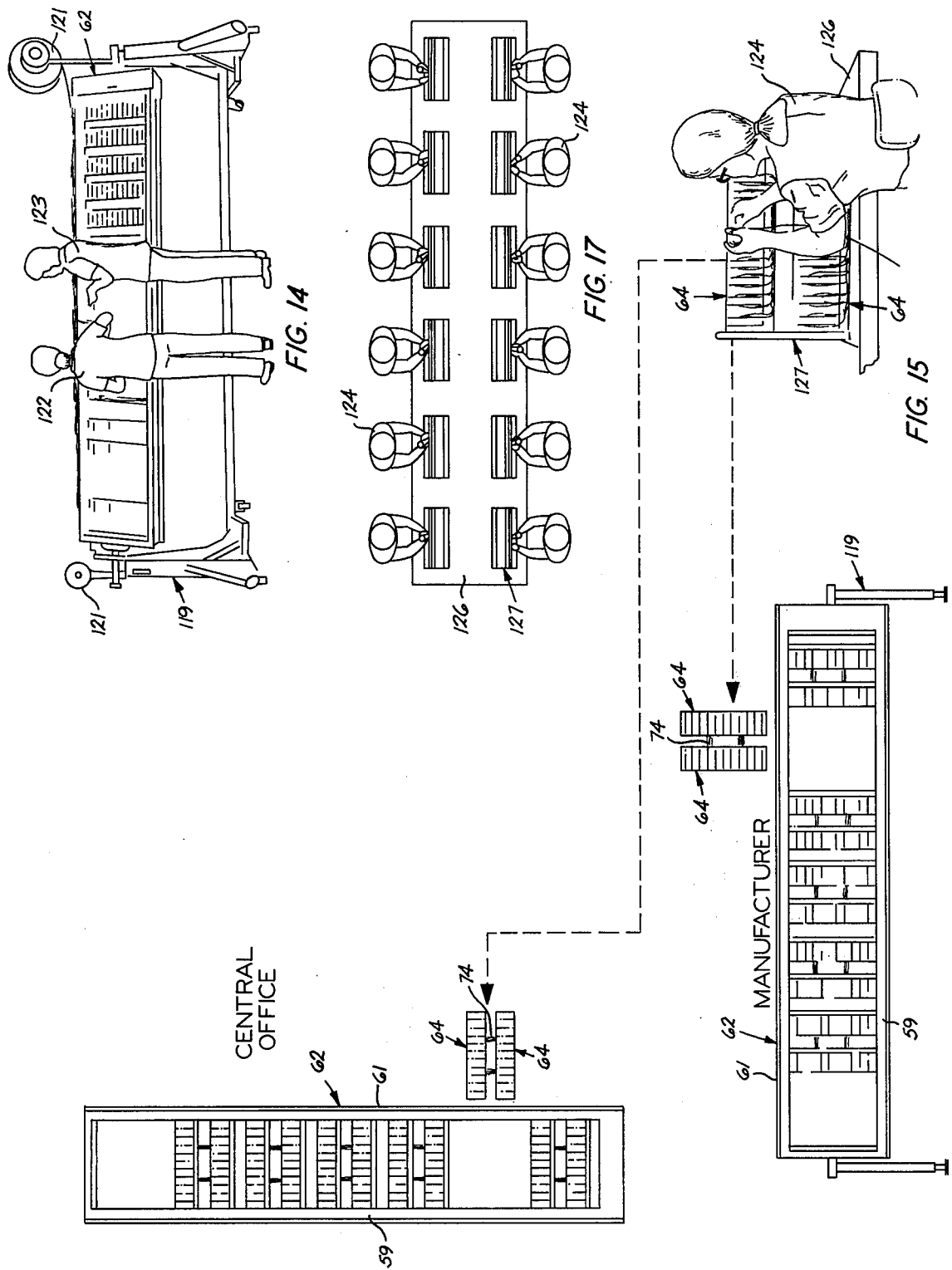

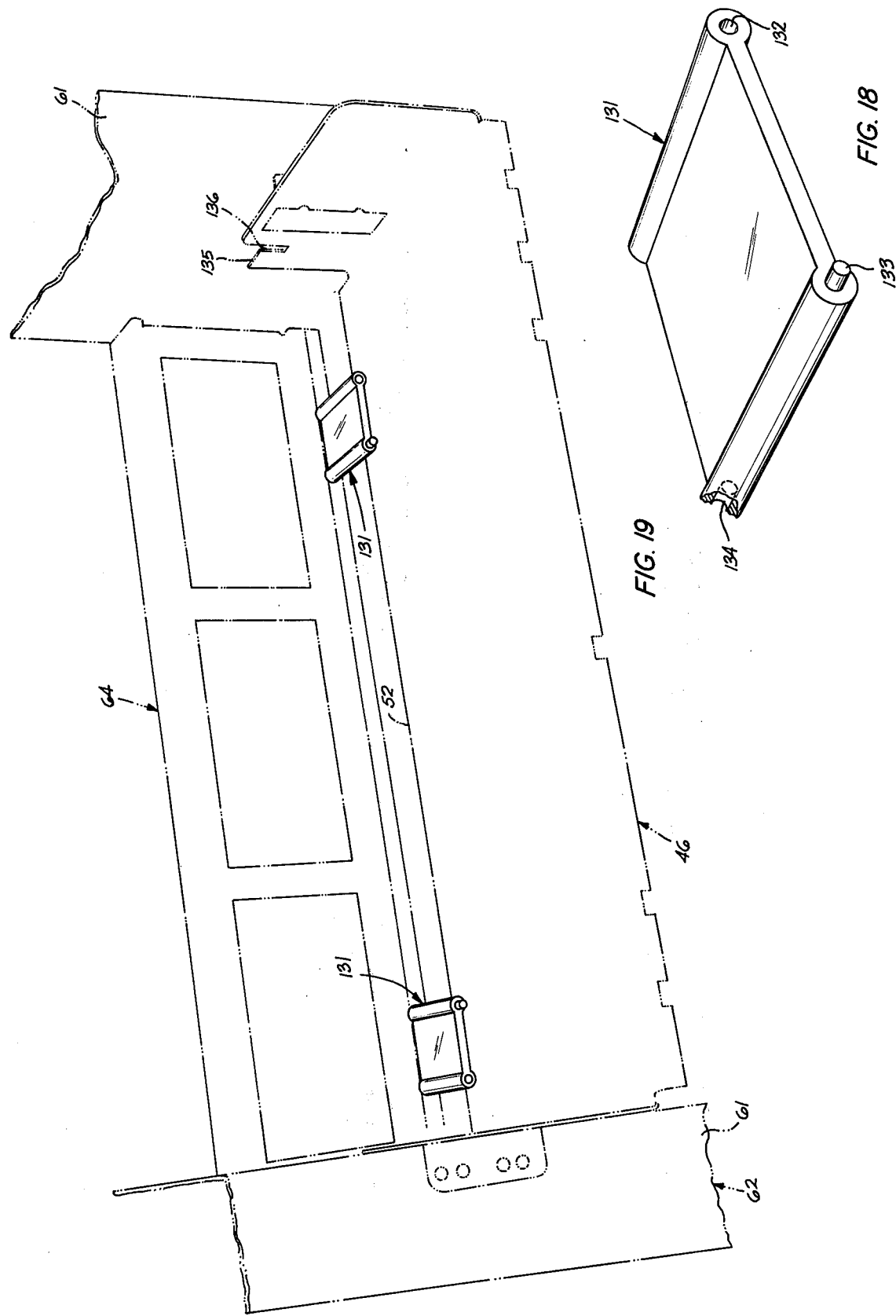

STRUCTURE FOR PROVIDING SUPPORT FOR CIRCUIT PLUG-IN UNITS, CONNECTORS AND RELATED WIRING

BACKGROUND OF THE INVENTION

1. Field of the Invention

This invention relates to structure for providing support for circuit plug-in units, connectors and related wiring. Particularly, this invention relates to a structure for supporting prewired electrical connectors in aligned assembly with circuit boards.

2. Description of the Prior Art

A typical central office contains a plurality of bays of communications equipment including circuit modules which are interconnected, in some instances, with each other and with other facilities in the central office. Each bay includes a frame which extends from floor level nearly to the ceiling and supports a plurality of spaced, horizontally arranged shelves. Each shelf is integrally formed with a vertically oriented back portion. The back portion of each shelf support a plurality of connectors which are secured thereto. Each connector is provided with a plurality of terminal pins extending outwardly from the frame on one side of the connector. The opposite side of each connector is formed with a receptacle having contact elements for engaging printed wiring board terminations of the circuit modules. The contact elements are connected through the connector to the terminal pins on the other side thereof.

The circuit modules are positioned on the shelves with the terminations thereof inserted into the receptacles of associated connectors mounted on the back portions of the shelves.

As noted above, various ones of the circuit modules on any one bay are interconnected with each other and are also interconnected with circuit modules located in other bays and other facilities in the central office. In order to facilitate the interconnections required in the central office, wire wrap connections are made on the terminal pins extending from the connectors. Thus it is easily seen that a maze of wire wrap connections and associated wiring is required to provide the necessary interconnection between the various modules and other central office facilities.

Since each bay extends from floor level to essentially ceiling level, it would be most difficult to make wire wrap connections of terminal pins which are at or near floor levels. In addition, it would also be difficult to make wire wrap connections at near-ceiling locations which would require a wire wrap operator to stand on a ladder or other platform. Further, in order to utilize as much of the central office floor space as possible, generally the space between rows of the bays is of limited access and would further hamper the movement of the wire wrap operator. Additionally, an extremely large number of wires is required within a central office in order to provide the necessary interconnections. Experience in wiring bays as described above has also shown that considerable time is also required to correct errors made in wiring made, on site, in the central office.

As one solution to the foregoing problems, each bay is assembled at an assembly shop wherein the connectors are secured to the back portions. The shelves and integrally formed back portions are then secured to a frame. The frame is then mounted on a stand so that the normally vertical axis of the frame is secured for rotation about a horizontal axis. This permits the positioning of the frame so that the terminal pins of all of the connectors extend in a direction which permits the wiring of various terminal pins on a point-to-point procedure by wire wrap operators.

A bank of terminal pins is also mounted on the frame at a central location to provide for interconnecting wiring between the bank and those terminal pins of the connectors of the bay which are to be ultimately connected to other bays and facilities in the central office. This provides an easily accessible location for wire wrap operations which must be performed at the central office. Thus, at the assembly shop, the wire wrap operators can also provide wiring from the terminal pins extending from each back portion to the bank of terminal pins at the central location on each bay.

The prewired bays are shipped to and installed in central offices. After the prewired bay has been installed in the central office, it is only necessary for a wire wrap operator to then make connections to the conveniently located bank of terminal pins at the central location of the bay in order to provide for interconnection between circuit modules of that bay to other bays and facilities in the central office. Circuit modules, which are shipped to the central office separately from the prewired bays, are thereafter inserted into the installed, prewired bays.

This procedure provides some solutions to the problems which would have been encountered if the bay had been wired entirely on location in the central office.

Each bay provides shelf support for various electrically different types of circuit modules. In some instances, the central office requirements do not call for a circuit module at every shelf position. Consequently, the bay is shipped to the central office for installation with some shelves being empty. However, in anticipation that future central office requirements will call for modules to be placed in some if not all of the empty shelves, and further, in order to avoid the previously mentioned problems of performing wire wrap operations in the central office when such modules are eventually called for, the entire bay is prewired as noted above in the assembly shop prior to shipping the partially module-filled bay to the central office. Thus, each bay that is shipped to a central office requires a full compliment of shelves and back portions with all terminal pins being interconnected to each other as required and to the bank of terminal pins of the central location even though not all shelves are contemplated for use at the time the bay is installed in the central office.

Therefore, a need exists to provide facilities and techniques for maintaining the advantages of prewiring the facilities at the assembly shop, but to eliminate the need for providing a fully wired compliment of shelves on each bay when not needed at the time the bay is shipped to the central office.

SUMMARY OF THE INVENTION

This invention contemplates supporting means for supporting an aligned array of circuit, plug-in units. Receiving means, independent of the supporting means, is fastenable to the supporting means and is formed with structure for receiving a plurality of connectors and for securing the connectors therewith.

The supporting means is formed with mounting structure to permit the supporting means to be secured to a supporting frame. The supporting means and the receiving means are each provided with mating structure which insures desired alignment thereof. In this manner, circuit plug-in units supported on the supporting means are placed in electrical engagement with specified connectors on the receiving means as the plug-in units are positioned fully on the supporting means.

The receiving means is provided with facilities for receiving and retaining wires in a confined routing between the connectors and areas external thereof.

BRIEF DESCRIPTION OF THE DRAWINGS

FIG. 1 is a perspective view showing a circuit plug-in unit such as an electronic circuit module including a printed wiring board;

FIG. 2 is a perspective view of an electrical connector with parts broken away to reveal terminal configuration therein;

FIG. 3 is a perspective view showing structural details at the top of a shelf for receiving one edge of circuit modules or boards of one prescribed thickness in accordance with certain principles of the invention;

FIG. 4 is a perspective view showing structural details of the bottom of the shelf of FIG. 3 for receiving another edge of circuit modules or boards of the one prescribed thickness;

FIG. 5 is a perspective view of the shelf of FIGS. 3 and 4 assembled with a support frame;

FIG. 7 is a partial perspective view showing details of the back plate of FIG. 6;

FIG. 8 is a perspective view of a plastic strap for facilitating retention of conductors with the back plate of FIG. 6 in accordance with certain principles of the invention;

FIG. 9 is a perspective view of a plastic insert which is assembled with the back plate of FIG. 6 to provide burr-free passageway for wires in the vicinity of the back plate;

FIG. 10 is a sectional view taken along line 10—10 of FIG. 9 showing the cross sectional configuration of the plastic insert of FIG. 9;

FIG. 14 is a pictorial view representing a prior art technique for prewiring a bay of communications equipment;

FIG. 15 is a pictorial view representing utilization of the back plate of FIG. 6 to provide prewired bays;

FIG. 17 is a pictorial view representing a procedure for prewiring the back plates of FIG. 6 in comparison to the prior art technique of FIG. 14;

FIG. 18 is a perspective view of a plastic spacer embodying certain principles of the invention;

FIG. 19 is a phantom perspective view of the shelf of FIG. 3 and the back plate of FIG. 6 assembled through the spacer of FIG. 18;

DETAILED DESCRIPTION

Figure 6:
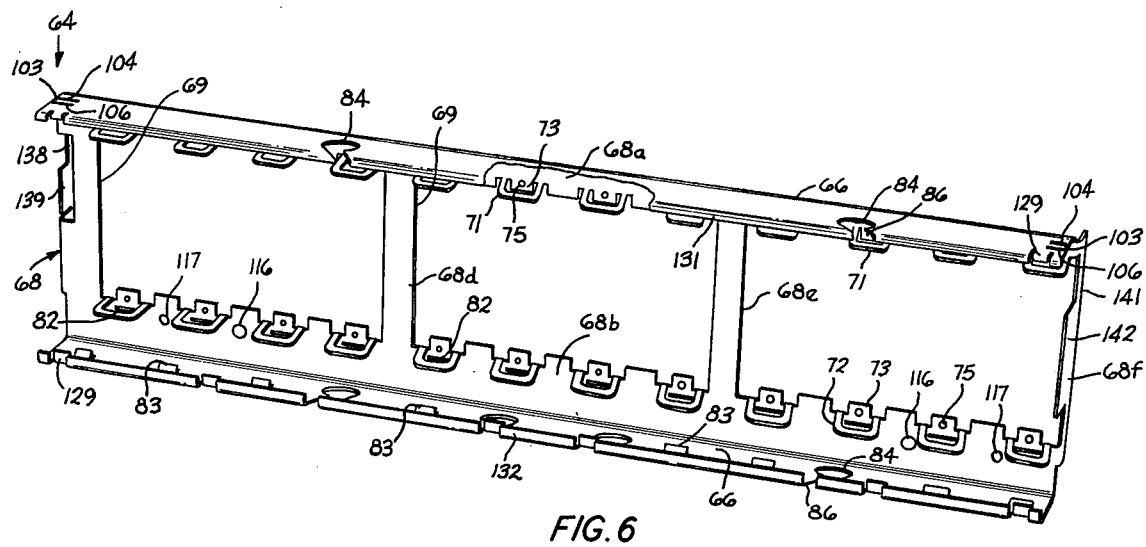
FIG. 6 is a perspective view of the back plate embodying certain principles of the invention.

Referring to FIG. 1, there is illustrated a circuit plug-in unit such as an electronic circuit module, designated generally by the numeral 26, which includes a printed wiring board 27 mounted into a carrier frame designated generally by the numeral 28. The printed wiring board 27 is secured to the carrier frame 28 by fastening members 29 and is formed with printed wiring termination fingers 31 at one end thereof.

The carrier frame 28 includes an upper rail 32, a lower rail 33 and a rear rail 34. The upper and lower rails 32 and 33 are each formed with a guide ridge 35 which extends along the length of each of the rails. Each of the guide ridges 35 are of a prescribed thickness. The carrier frame 28 is also formed with a front panel 36 which can be provided with facilities such as slide-operated switches for establishing circuit parameters for circuits on the printed wiring board 27.

It is to be understood that, even though the circuit module 26 illustrates a circuit plug-in unit, a circuit plug-in unit could also include a printed circuit board unsupported by a carrier frame.

Referring now to FIG. 2, there is illustrated a connector designated generally by the numeral 37. The connector 37 is formed with a plastic body 38 with stepped end portions 39 and 41. A plurality of terminals, designated generally by the numeral 42, are secured within portions of the connector body 38 with a portion of each terminal extending from one side of the connector body and appearing as terminal pins 43. The remaining portion of each of the terminals 42 is contained within the connector body 38 with portions thereof extending into an elongated receptacle 44 formed in the connector body. The size of the receptacle 44 permits the insertion of the portion of the printed wiring board 27 (FIG. 1) containing the termination fingers 31 so that each termination finger engages the portion of one of the terminals 42 within the receptacle. Connections can then be made to the pins 43, for example by wire wrap operations, to facilitate connection of the circuits on the printed wiring board 27 with external facilities (not shown). Each of the stepped end portions 39 and 41 of the connector body 38 are formed with through holes 45 to provide for one form of assemblying the connector with a supporting member (not shown).

Referring now to FIG. 3, there is illustrated a shelf, designated generally by the numeral 46, which is formed from flat sheet metal by various stamping and metal bending operations. The shelf 46 includes a generally flat shelf portion 47 having on the top surface thereof a plurality of rows of upstanding tabs designated generally by the numeral 48 (only two rows are illustrated).

The tabs 48 are arranged in a plurality of rows with adjacent rows of the tabs forming module-board guide passageways designated generally by the numeral 49. Since the tabs 48 form a plurality of identical guide passageways 49, the orientation of only two rows of the tabs 48 which form a single guide passageway 49 will be discussed. It is to be understood that the remaining rows of the tabs 48 cooperate in an identical fashion.

A first row of tabs 48a are positioned in alignment from a front 51 to a back 52 of the shelf 46 and define a first edge of one guide passageway 49. A second row of tabs 48b are located in spaced alignment from the front 51 to the back 52 of the shelf 46 and are spaced from the first defined edge of the guide passageway 49 to define a second edge of the guide passageway. The width of the space defined by the first and second edges of the guide passageway 49 is slightly larger than the prescribed thickness of the ridges 35 of the circuit module 26. A pair of tabs 48c and 48d, which are aligned generally with the first and second edges, respectively, of the guide passageway 49, are slightly flared apart at the front 51 of the shelf 46 to provide easy insertion of the circuit module 26 (FIG. 1) into the guide passageway. The remaining tabs 48a and 48b facilitate the guiding of the circuit module 26 inserted therein. Collectively, the tabs 48a, 48b, 48c and 48d receive and guide the ridge 35 of the lower rail 33 of the carrier frame 28.

As noted above, an unsupported circuit board of the prescribed thickness could also be inserted into the guide passageway 49 for support therein in the same manner as the circuit module 26.

As further illustrated in FIG. 3, a plurality of downwardly turned tabs, designated generally by the numeral 53, are formed in the underside of the shelf 46.

Referring now to FIG. 4, there is illustrated the underside of the shelf 46 which is shown in the inverted position to reveal the underside tabs 53. Each tab 53a in a first row of the underside tabs is formed with an upstanding ear 53b and a turned ear 53c which is parallel to the shelf portion 47. Each tab 53d in a second row of the underside tabs, which is spaced adjacent to the first row, is formed with an upstanding ear 53e and a turned ear 53f which iss also paralled to the shelf portion 47. The ears 53c are turned toward the second row of tabs 53d and the ears 53f are turned toward the first row of tabs 53a. The turned ears 53c and 53f cooperate to provide the base, and the ears 53b and 53e cooperate to provide the side walls, for a module-board guide passageway 54 for receiving the ridge 35 of the upper rail 32 of the circuit module 26 (FIG. 1). Obviously, the width of the guide passageway 54 is slightly greater than the prescribed thickness of the ridge 35. Each of a plurality of notches 55 formed in the front 51 of the shelf 46 form the leading portion of one of the guide passageways 54 and are aligned with the tabs 53a and 53d and further facilitate guiding insertion of the guide ridge 35 of the upper rail 32 of the carrier frame 28 into the guide passageway.

Referring again to FIG. 3, the shelf 46 is further formed with upturned sides 56 each of which is formed with outwardly turned flanges 57. Each of the flanges 57 is formed with a plurality of mounting holes 58.

Referring now to FIG. 5, there is illustrated vertically oriented side rails 59 and 61 of a partially illustrated support frame designated generally by the numeral 62. The support frame 62 is typically located in a telephone central office and extends from floor level to nearly ceiling level and provides support for a plurality of horizontally spaced shelves 46 (three shown). As illustrated in FIG. 5, fasteners 63 are used to secure the flanges 57 of the shelves 46 to the side rails 59 and 61 of the frame 62.

As further illustrated in FIG. 5, the circuit module 26 is supported at top and bottom thereof by the uppermost shelf 46 and the next lower shelf. Thus, the tabs 53 (FIG. 3) on the underside of the uppermost shelf 46 provides guiding support for the upper portion of the circuit module 26 while the tabs 48 (FIG. 3) provide guiding support for the lower portion of the circuit module.

Referring now to FIGS. 6 and 7, a back plate, designated generally by the numeral 64, is formed from flat sheet metal by various stampiing and bending operations to form a generally elongated U-shaped channel with an elongated upper section 66, an elongated lower section 67 spaced from the upper section and joined therewith by an integrally formed, interconnecting, web section designated generally by the numeral 68. Three elongated openings 69 are formed in the web sections 68 such that the remaining portions of the web section form an upper web portion 68a, a lower web portion 68b, a right-angle post 68c at one end, two intermediate posts 68d and 68e and a flat post 68f at the other end. Three elongated openings 69 are formed in the back plate 64. A plurality of bendable upper connector-securing enclosures 71 and bendable lower connector-securing enclosures 72 are formed integrally with the web portions 68a and 68b, respectively, along spaced opposed edges of the openings 69. Typically, the upper enclosures 71 extend generally perpendicular to the plane of the web section 68 and the lower enclosures 72 are angled downwardly with respect to the web section as illustrated particularly in FIG. 7.

Referring to FIG. 7, a plurality of the connectors 37 (FIG. 2) are to be assembled with the back plate 64. For example, as illustrated in FIG. 7 and with respect to the assembly of one connector 37, the stepped end portion 39 of the connector 37 is inserted into the opening of the upper enclosure 71 and the other stepped end portion 41 is moved to a position above the lower enclosure 72. Each of the stepped end portions 39 and 41 rest against one of a plurality of stop tabs 73 located in the web section 68 along upper and lower edges of the opening 69 and adjacent to each of the enclosures 71 and 72. Thereafter, the lower enclosure 72 is urged upwardly to position the enclosure about the stepped end portion 41 of the connector 37. This same process is repeated for other connectors 37 and provides for the securing of the connectors with the back plate 64 in a predetermined location established by the relative positioning of the enclosures 71 and 72 along the spaced edges of the openings 69 during the forming of the back plate 64.

It is noted that each stop tab 73 is formed with a through hole 75 to facilitate securing the connector 37 with the back plate 64 by inserting a fastener (not shown) through the connector through holes 45 and the stop tab through holes.

Subsequent to the assembly of the connectors 37 with the back plate 64, wires 74 (partially shown) are connected to the pins 43 of the connector 37. The wires 74 extending from the various pins 43 of the plurality of connectors 37 extend generally from the pins and are grouped and routed together along the inner portion of the lower section 67 of the back plate 64. To facilitate the retention and routing of the grouped wires 74 along the lower section 67, a plastic strap, designated generally by the numeral 76, and more clearly illustrated in FIG. 8, is used. The plastic strap 76 is formed with a T-shaped head 77 at one end and a large cylindrical portion 78 and a small cylindrical portion 79 adjacent thereto at the other end with the ends being integrally connected by a web portion 81.

Referring to FIG. 7, the plastic strap 76 is assembled with the back plate 64 by snapping the small cylindrical portion 79 into one of a plurality of elongated slots 82 formed in the lower web portion 68b, then extending the strap web portion 81 over the wires 74 and positioning the T-shaped head 77 under a tab 83 formed in the lower section 67. A plurality of the straps 76 can be assembled in like manner at selected locations along the lower section 67.

The elongated slot 82 is dimensioned sufficiently to permit the small cylindrical portion 79 (FIG. 8) of the strap 76 to be slightly compressed as it passes therethrough whereafter the small cylindrical portion returns to its original shape. The large cylindrical portion 78 prevents additional portions of the strap 76 from passing through the elongated slot 82. In this manner, the strap 76 is then retained with the back plate 64.

Frequently, some of the wires 74 are directed from one back plate 64 to an adjacent back plate. In order to retain the wires in a dressed and routed grouping, openings 84 are in the upper and lower sections 66 and 67. Each opening 84 communicates with a slot 86 which extends through the adjacent edge of either the upper or lower sections 66 and 67, respectively, and provides lateral access to the opening.

Referring to FIGS. 7, 9 and 10, a plastic insert, designated generally by the numeral 87, has a cylindrical body 88, a central opening 89 and a peripherally flanged end 91. The outer diameter of the cylindrical body 88 is slightly less than the diameter of the opening 84 formed in the back plate 64. An intermediate portion of the periphery of the cylindrical body 88 is formed with a tapered shoulder 92 which is spaced from the flanged end 91 to form a peripheral recess 93. The vertical dimension of the recess 93, as viewed in FIG. 10, is slightly larger than the thickness of the upper section 66 of the web section 68. In addition, as illustrated in FIG. 9, the plastic insert 87 is formed with a slot 94 which extends through the insert to provide communication with the central opening 89.

Referring again to FIG. 7, the plastic insert 87 can be manually manipulated so that the facing walls of the slot 94 are urged together. This has the effect of reducing the overall diameter of the insert 87. The insert 87 can then be positioned within the opening 84 of the back plate 64 to position the recess 93 in the plane of the upper section 66 of the back plate. When the insert is released, it returns to its original configuration as illustrated in FIG. 8 and the recess 93 and the adjacent spaced portions of the flanged end 91 are positioned about portions of the upper section 66 of the back plate 64 adjacent to the opening 84 to thereby retain the insert with the back plate. The insert 87 can be rotated within the opening 84 so that the slot 94 of the insert is aligned with the slot 86 of the opening 84 to thereby permit lateral access to the central opening 89 of the plastic insert.

When it is desired to position some of the wires 74 within the central opening 89 of the insert 87, the insert is rotated so that the slots 86 and 94 are aligned. The wires 74 are then moved laterally into the central opening 89 whereafter the plastic insert 87 is again rotated to move the slot 94 out of alignment with the slot 86. In this manner, other portions of the plastic insert 87 then block the slot 86 so that the wires 74 which pass through the central opening 89 are retained therein.

Figure 11:
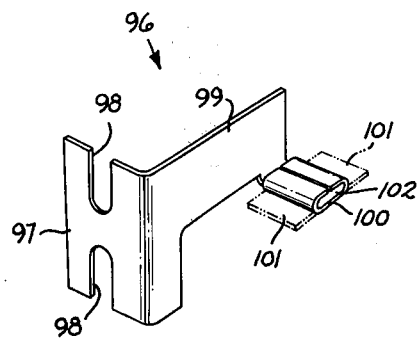
FIG. 11 is a perspective view of a bracket in accordance with certain principles of the invention which is attachable to the back plate of FIG. 6 to facilitate assembly of the back plate to the frame illustrated in FIG. 5.

Referring now to FIG. 11, there is illustrated a bracket designated generally by the numeral 96 which includes an H-shaped section 97 having fastener-receiving slots 98 formed therein. The bracket 96 further includes a side portion 99 which is formed integrally with one edge of the H-shaped section 97 and extends generally perpendicularly therefrom. A fastener section 100 extends perpendicularly from the side portion 99 and is formed integrally therewith. The fastener section 100 is formed by folding flat ear portions 101 (shown in phantom) inwardly to form a narrow elongated opening 102.

Figure 16:
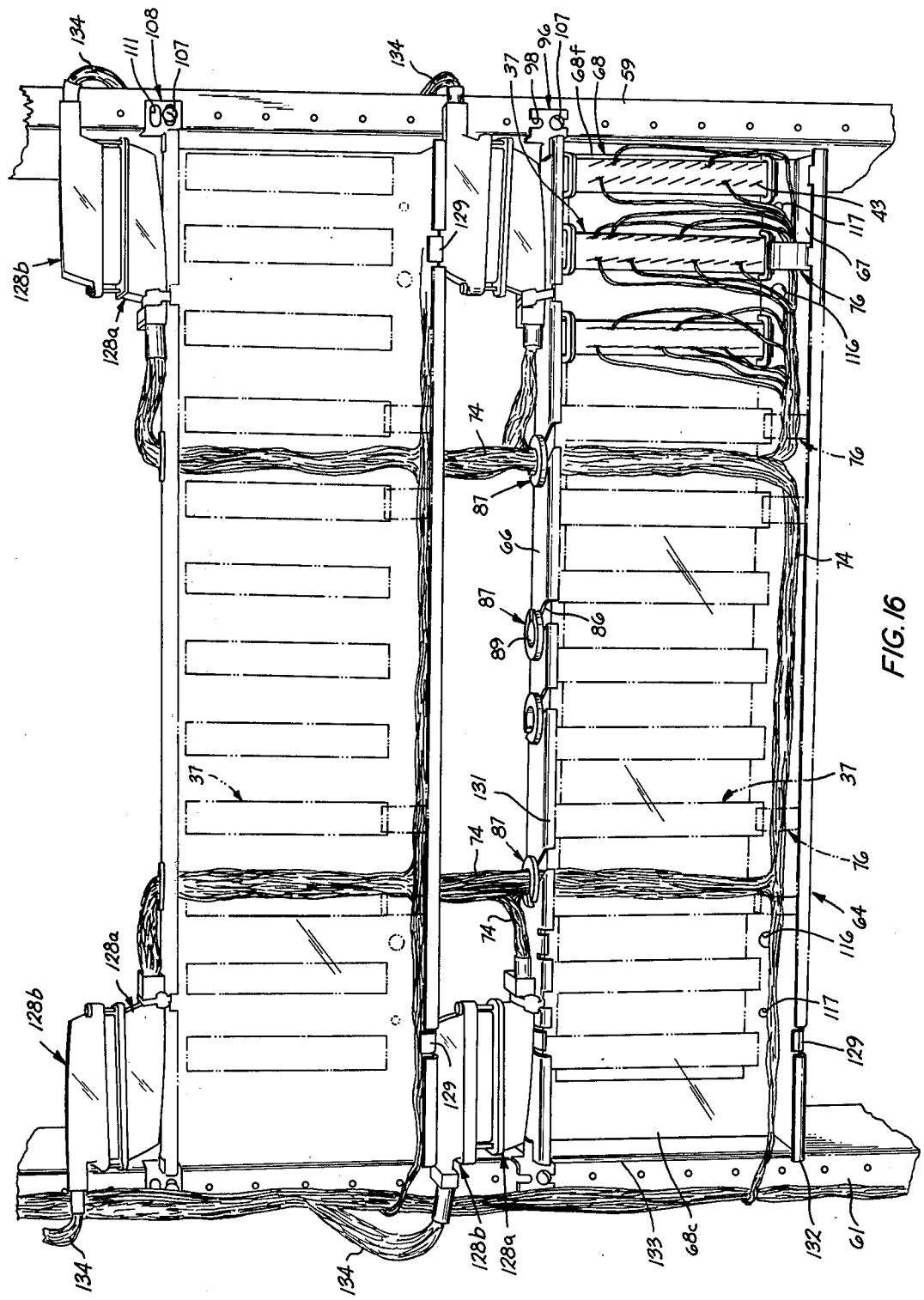
FIG. 16 is a perspective view showing the back side of a pair of the back plates of FIG. 6 in prewired assembly and mounted to the support frame of FIG. 5.

Referring to FIGS. 7 and 11, the bracket 96 is positioned so that the opening 102 of the fastener section 100 is aligned with a tab 103 formed in the end edge portion of the upper section 66 of the back plate 64. The tab 103 is formed by forming spaced slots 104 and 106 into the end edge portion of the upper section 66. The opening 102 of the fastener section 100 of the bracket 96 is moved over the tab 103 whereby the bracket is secured by friction to the back plate 64. An identical bracket 96 (not shown) is assembled in the same fashion at the opposite end of the upper section 66 so that the H-shaped sections 97 of the two assembled brackets 96 are in the same plane. The back plate 64 can then be positioned adjacent to the back side of the support frame 62, as illustrated in FIG. 16, and fasteners 107 can be used to secure the brackets 96 to the side rails 59 and 61 and thereby secure the back plate 64 to the frame 62.

Figure 12:
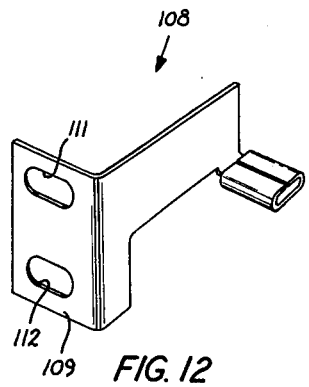
FIG. 12 is a perspective view of an alternate mounting bracket in accordance with certain principles of the invention.

Referring now to FIG. 12, there is illustrated an alternate embodiment of a bracket designated generally by the reference numeral 108. The bracket 108 is identical to the bracket 96 except that the H-shaped section 97 is replaced by a plate section 109 having a pair of spaced elongated holes 111 and 112. A pair of the brackets 108 can be assembled with the back plate 64 in the same manner as the assembly of the brackets 96 therewith. The orientation of the elongated holes 111 and 112 in the bracket 108 permits the use of the fasteners 107 for providing horizontal adjustment of the back plate 64 relative to the frame 62 (FIG. 16) in the event such adjustment is needed to insure the alignment of the back plate-mounted connectors 37 with the guide passageways 49 and 54 of the shelf 46.

Figure 13:
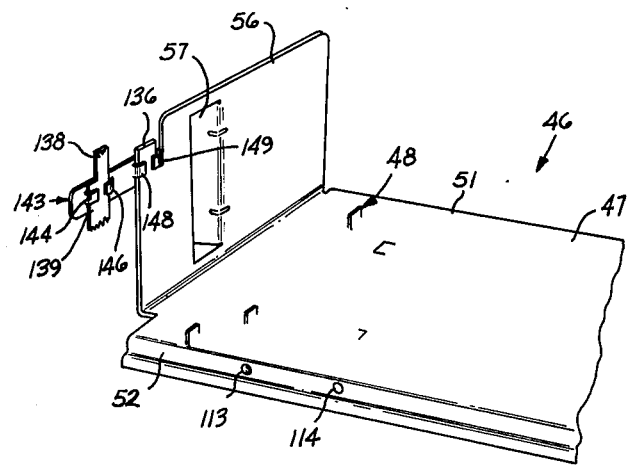
FIG. 13 is a partial perspective view showing a rear portion of the shelf of FIG. 3.

Referring now to FIG. 13, there is illustrated a partial view of the back 52 of the shelf 46 (FIG. 3) wherein a threaded hole 113 and an unthreaded hole 114 are formed adjacent one end thereof. A similar pair of holes are formed at the opposite end of the back 52 of the shelf 46. Referring now to FIGS. 6 and 7, there is illustrated a guide pin 116 which extends from the front side of the back plate 64 along the lower edge of the lower web portion 68b. In addition, a hole 117 is formed in the web section adjacent to the guide pin 116. Similarly, another pin 116 and hole 117 (FIG. 6 only) are located in the lower web portion 68b near the opposite end of the back plate 64. When the shelf 46 and the back plate 64 are assembled with the frame 62 as illustrated in FIG. 5 and also in FIG. 16, the guide pins 116 of the back plate are inserted into the holes 114 (FIG. 13). Also, the holes 117 in the back plate 64 are aligned with the threaded holes 113 (FIG. 13) in the shelf 46. This insures the proper alignment of the back plate 64 with the shelf 46 in the assembled relation. Thereafter, fastener members 118, as illustrated in FIG. 16, are utilized to fasten the back plate 64 to the shelf 46. As previously noted, fastener members 107 are also used to secure the brackets 96 and 108, and the back plate 64, to the frame 62.

In the assembled relation as illustrated in FIG. 5, the connectors 37, which are mounted on the back plate 64, are aligned with the guide passageways 49 and 54 of the shelves 46. When the circuit modules 26 (FIG. 1) are inserted into the guide passageways 49 and 54, the termination fingers 31 (FIG. 1) of the printed wiring board 27 of each module are inserted into the receptacle 44 of the associated connector 37 to engage the portions of the terminals 42 which are contained within the receptacle.

Referring now to FIG. 14, there is illustrated a support stand, designated generally by the numeral 119, which supports the frame 62 thereon. The frame 62 is supported at the opposite ends thereof which normally serve as the bottom and top thereof so that the normal longitudinal vertical axis of the frame is in a horizontal position. The stand 119 supports the frame 62 for rotation about the horizontally disposed longitudinal axis of the frame. The stand 119 also supports at the upper opposite ends thereof a plurality of supply reels, designated generally by the numeral 121, which support supplies of insulated wire. In the past, the assembly for supporting the circuit modules 26 (FIG. 1) and the connectors 37 (FIG. 2) was provided by an integrally formed cast metal shelf and back plate assembly (not shown). The connectors 37 were initially secured to the back plate portion of the integrally formed shelf and back plate assembly by the use of separate fastener members, such as screws, the through holes 45 of the connectors and threaded holes in the cast metal assembly. A plurality of such connector supporting shelf and back plate assemblies were then assembled with the frame 62. For reasons expressed hereinbefore, each position on the frame 62 was occupied by a shelf and back plate assembly. In addition, a bank of terminal pins (not shown) were assembled with the frame 62 at a central location whereat connections were made from other terminal pin locations on the same frame to provide an easily accessible central location for connection to external facilities after the completely wired frame had been assembled as a bay in a telephone central office.

After a plurality of connector supporting shelf and back plate assemblies and the centrally located bank of terminal pins had been assembled with the frame 62, the frame was mounted on the stand 119 as illustrated in FIG. 14. Two wire operators 122 and 123 used wire wrap tools to provide the necessary point-to-point wiring between various terminal pin points throughout the entire frame 62. In addition, those terminal pin points located at one or more of the connectors 37, which had to be ultimately connected to external facilities in the central office, were connected to selected terminal pin points in the central bank of terminal pins.

The two wire wrap operators 122 and 123 worked together to complete the wire wrap connection of a given wire at opposite ends thereof to selected terminal pin points and further to insure that the wire was of sufficient length to provide an orderly routing of the wire from one point to the other. This procedure was accomplished by alternately using the supplies 121 of wire from opposite ends of the stand 119. For example, the operator 122 would pull a length of wire from the supply 121 at the left end of the stand 119 and hand the leading end of such wire to the operator 123 who would then strip the insulation from the leading end and make connection to the selected terminal pin point. Thereafter, the operator 122 would position the insulated portions of the wire in an orderly routing to the termination pin point whereat the opposite end of the wire was to be connected. Operator 122 would then sever the wire from the supply 121 at the left end of the stand 119, strip the insulation from the severed end and wire wrap the wire to the selected terminal pin.

During the period when the operator 122 was routing the wire and securing the other end to the second selected terminal pin point, the operator 123 would pull an insulated wire from the supply 121 at the right end of the stand 119 in preparation for the next wiring operation. The wiring operation would then proceed in a manner similar to the previously explained procedure except that the operator 122 would perform the leading-end wire wrap connection and the operator 123 would perform the routing and trailing-end wire wrap operation.

While this technique had many advantages, only two wire wrap operators could perform in the floor space required to support the stand 119 with the frame 62 thereon. Also, only two operators could perform wire wrap operations for all of the connectors 37 on the entire frame 62 thereby requiring considerable time and space.

Referring now to FIG. 15, there is illustrated an operator 124 seated at a workbench 126 which supports a fixture designated generally by the numeral 127. The fixture 127 is provided with facilities (not shown) for supporting two back plates 64 having connectors 37 assembled therewith. The back plates 64 are supported in the fixture, one above the other, in a spaced arrangement. With this arrangement, the operator 124 can readily perform necessary strap wiring between terminal pins 43 (FIG. 2) of the connectors 37 mounted on each one of the plates 64 and also provide the necessary wire wrap connections to the terminal pins 43 which are ultimately connected to external facilities upon assembly in the telephone central office.

In order to provide for the ready connection of the terminal pins 43 to external facilities in the telephone central office, insulation-displacement connector plugs, designated generally by the numeral 128a (FIG. 16), are preassembled and connected with insulated wires 74 of prescribed lengths.

Referring to FIG. 16, the operator 124 (FIG. 15) positions one of the connector plugs 128a at the upper outer end of the upper section 66 of the back plate 64 and straps the connector plug to the back plate in this position. The operator 124 then positions the wires 74 of the connector plug 128a through one of the slots 86 of the back plate 64 and the aligned slot 94 of the plastic insert 87 to position the wires within the opening 89 of the plastic insert. The plastic insert 87 is then rotated to block the slot 86 and thereby retain the wires 74 within the opening 89. The ends of the wires 74 are then stripped of insulation and wire wrapped to selected terminal pins 43 of the connectors 37 by the operator 124.

In addition, other wires 74 which are not connected to the connector plugs 128a are also positioned within the opening 89 of the plastic insert 87 in a similar fashion and connected at one end thereof to terminal pins 43 of connectors 37 mounted to the lower back plate 64 on the fixture 127 (FIG. 15). The opposite ends of such wires 74 are connected to terminal pins 43 of the connectors 37 mounted on the upper back plate 64 secured to the fixture 127. While the upper and lower back plates 64 are still mounted to the fixture 127, the operator 124 assembles the plastic strips 76 at the required locations and assembles the brackets 96 or 108 with the upper and lower back plates.

Referring to FIGS. 6, 7 and 16, a plurality of spaced tabs 129 are formed in front rolled lips 131 and 132 of the upper and lower sections 66 and 67, respectively, of the back plate 64. The front edge of each of the tabs 129 is spaced from the back edge of the rolled lips 131 and 132. The space between the tabs 129 and the rolled lips 131 and 132 is sufficient to receive, upon insertion by the operator 124 (FIG. 15), a clear plastic protective sheet 133 which provides protection for all of the wire wrap connections and elements behind the sheet. It is noted that the sheet could be used to support other elements to be assembled with the bay in the central office.

The complete assembly of two prewired back plates 64 is then removed from the fixture 127. The two, completely wired side-by-side back plates 64 are retained in this relationship by the interconnecting wires 74 (FIGS. 15 and 16) extending therebetween. This permits the assembly of the two back plates 64 to be folded one on the other and easily transported in the folded arrangement.

As further illustrated in FIG. 15, the completely wired pair of back plates 64 can be transported from the position of the workbench 126 to an assembly-shop position in the manufacturer's location where the frame 62 is supported on the stand 119. The completely wired assembly of the two back plates 64 can then be assembled and secured with the frame 62 without the necessity of having to perform wiring operations at the assembly-shop position.

In some instances, previously shipped bays may not have required that all shelf and back plate locations of the bays be occupied because central office requirements did not warrant a full bay at that time. If later required, the empty shelf and back plate locations of the bay can be filled in the central office by shipping a prewired assembly of back plates 64 as illustrated in FIG. 15. In addition, the required number of shelves 46 can also be shipped. The wired back plates 64 and the shelves 46 can then be readily assembled with the frame 62 in the central office without the necessity of making wire wrap connections in the central office in order to add additional circuit modules 26 for expanded operational capabilities in the central office.

It is to be noted that, if a single prewired back plate 64 is called for, the operator 124 can accomplish this in the same fashion.

Referring again to FIG. 16, there is illustrated a plurality of cables 134 which are connected, at least at one end thereof, to connector plugs 128$b$ which are identical to and mate with the connector plugs 128$a$ assembled with the back plates 64. After the prewired frames 62 have been assembled in the central office, the connector plugs 128$b$ of each of the cables 129 are assembled at one end thereof to the connector plugs 128$a$. The other ends of the cables 134 may be connected to connector plug 128$b$ at the other end thereof or they may be connected individually and directly to other central office facilities other than connector plugs. This provides connection for the circuit modules 26 with external facilities beyond the particular frame 62 which supports the shelves 46 and back plates 64 associated with the circuit modules.

This connectorized assembly technique permits essentially all wiring to be accomplished at a manufacturing or assembly location and essentially eliminates the need for wire wrap operations within the central office.

Referring to FIG. 17, there is illustrated a plurality of operators 124 seated at work positions located on a workbench 126. Each work position includes one of the fixtures 127 for supporting a pair of the back plates 64 in the upper and lower arrangement as illustrated in FIG. 15. The floor space required for the workbench 126 is essentially equal to the floor space required by the stand 119 as illustrated in FIG. 14. Yet, by using the principal of prewiring the back plates 64, and the assembly thereof with the frame 62 as discussed above with respect to FIGS. 15 and 16, twelve operators 124 can now perform wiring operations in the same space previously occupied by only two operators 122 and 123 (FIG. 14). Needless to say, this presents the opportunity for considerable economies in time and space.

Referring now to FIG. 18, there is illustrated a plastic spacer, designated generally by the numeral 131, which is formed with a hole 132 extending through the spacer from one end to the other. A pin 133 extends from one surface of the spacer 131 in a location spaced from the hole 132 and having an axis in parallel with the axis of the hole. In addition, an opening 134 is formed in the end of the spacer 131 opposite the end from which the pin 133 extends and in axial alignment with the pin.

Referring now to FIG. 19, there is illustrated, in phantom view, the shelf 46 and the back plate 64. On occasion, circuit modules (not shown) of greater depth dimensions than that of the circuit module 26 (FIG. 1) are required to be mounted in the frame 62. To avoid the necessity of manufacturing additional shelves 46 with a depth dimension to support the larger circuit module, a pair of the spacers 131 are inserted between the back 52 of the shelf 46 and the lower front edge of the back plate 64. The pins 133 of the pairs of spacers 131 is inserted into the openings 114 (FIG. 13) formed in the back 52 of the shelf 46. When the back plate 64 is positioned in flush engagement with the spacers 131, the pins 116 (FIG. 7) protruding from the front of the back plate 64 is inserted into the openings 134 of the pair of spacers 131 to insure proper alignment of the back plate with the shelf 46. Fastening members (not shown) are then inserted through the openings 117 (FIGS. 6 and 7) of the back plate 64, through the openings 132 of the pair of spacers 131 and into the threaded holes 113 (FIG. 13) formed in the back 52 of the back plate 46. In this manner, the back plate 64 is assembled in the desired alignment with the shelf 46.

Thus, a single size shelf 46 and a single size back plate 64 can be manufactured and still accommodate circuit modules of different depth dimensions by use of the spacer 131.

Referring to FIG. 3, the rear upper corner of each side 56 of the shelf 46 is formed with a tab 135 and a space 136 adjacent thereto.

Referring to FIGS. 6 and 7, the right-angle post 68$c$ is formed with an enclosed slot 137. The formation of the slot 137 results in the forming of a reduced width section 138 and larger width section 139 in the right-angle post 68$c$. Referring to FIG. 6, the flat post 68$f$ is formed with a reduced width section 141 and a larger width section 142. The reduced width sections 138 and 141 of the back plate 64 are of the same width dimension. Also, the larger width sections 139 and 142 of the back plate 64 and the tabs 135 of the shelf 46 are of the same width dimension.

Figure 20:
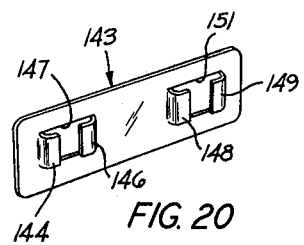
FIG. 20 is a perspective view of a strap for holding the shelf of FIG. 3 and the back plate of FIG. 6 in assembled relationship in accordance with certain principles of the invention.

Referring to FIG. 20, there is illustrated a heavy duty metal strap designated generally by the numeral 143. The metal strap 143 is formed with a first pair of opposed ears 144 and 146 which are stamped from a single opening 147. A second pair of opposed ears 148 and 149 are also formed in the metal strap 143 from another single opening 151 in the strap.

The space between the ears 144 and 146 and the space between the ears 148 and 149 are each slightly wider than the width dimension of the reduced width sections 138 and 141 of the back-plate posts 68c and 68f, respectively. Each of the openings 139 and 143 of the metal strap 143 has a dimension in the longitudinal direction of the strap which is slightly larger than the larger width sections 139 and 142 of the back-plate posts 68c and 68f and the tabs 135 of the shelf 46.

On occasion, it is desirable to fasten the back plate 64 to the shelf 46 by the fasteners 118 (FIG. 16) and then to use a pair of the sturdy metal straps 143 attached to the shelf and back plate to securely hold and support the shelf and back plate in the assembled relationship. When the metal strap 143 is used, only the shelf 46 is secured to the frame 62 (FIG. 5) and neither the bracket 96 (FIG. 11) nor the bracket 108 (FIG. 12) is assembled with the back plate 64 which is not secured to the frame.

Figure 21:
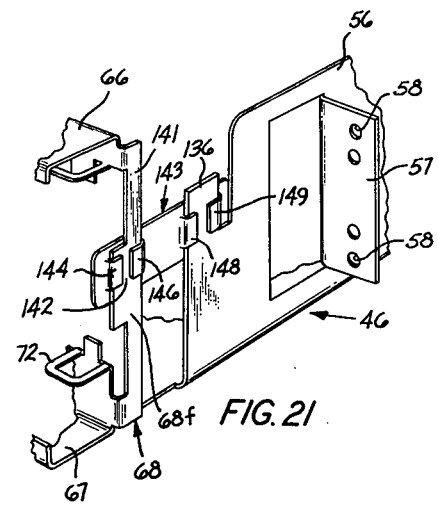
FIG. 21 is a perspective view of the strap of FIG. 20 in assembly with the shelf and the back plate.

Referring to FIG. 21, in order to assemble a pair of the straps 143 with the shelf 46 and back plate 64, the strap 143 is positioned so that the space between the ears 144 and 146 is moved about the reduced width section 141 of the post 68f of the back plate 64. At the same time, the ears 148 and 149 are positioned above the tab 136 of the adjacent side 56 of the shelf 46. The strap 143 is then moved downwardly so that the ears 144 and 146 are positioned about the larger width section 142 of the post 68f and the ears 148 and 149 are positioned about the tab 136 of the shelf side 56. A friction fit results between the strap 143 and the back plate 64 and shelf 46.

Referring again to FIG. 13, another strap is positioned so that the space between the ears 144 and 146 is moved about the reduced width section 138 of the back-plate post 68c. At the same time, the ears 148 and 149 are positioned above the tab 136 formed in the other side 56 of the shelf 46. The strap 143 is then moved downwardly to position the ears 144 and 146 about the larger width section 139 of the back-plate post 68c and the ears 148 and 149 are positioned about the tab 136 of the shelf side 56.

Thus, the back plate 64 is entirely supported by the shelf 46 by virtue of the pair of straps 143, as assembled in FIGS. 13 and 21, which provides rigid strength and alignment between the shelf and back plate. The shelf 46 is then secured to the frame 62 (FIG. 5).

As noted above, the circuit plug-in unit could include a printed circuit board unsupported by a carrier frame. However, the printed circuit board is typically of less thickness than the ridges 35 of the circuit module 26 (FIG. 1) and, thus, represents a lesser prescribed thickness. In order to accommodate the lesser prescribed thickness, and referring to FIG. 22, a plastic insert track, designated generally by the numeral 152, is formed to be inserted into the guide passageway 49 on the top of the shelf 46 (FIG. 3). To facilitate this insertion, a plurality of through holes 153 and an offset front slot 154 are formed in the top of the flat shelf portion 47 of the shelf 46 as illustrated in FIGS. 3 and 22.

Figure 22:
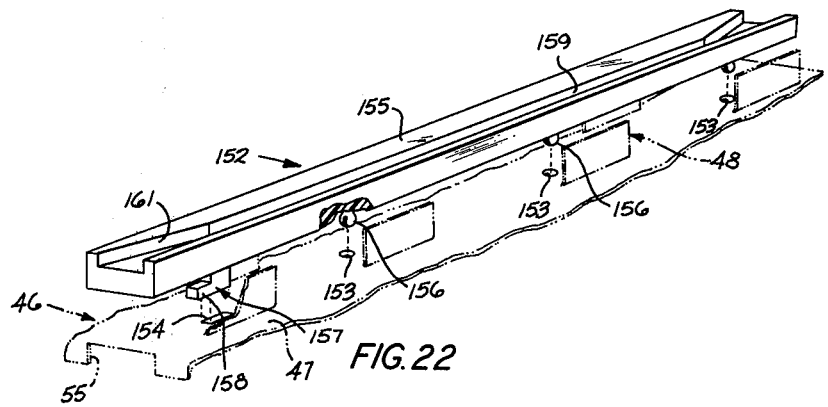
FIG. 22 is a perspective view of a plastic track insert to be assembled with the shelf of FIG. 3 for receiving one edge of a circuit plug-in unit such as a printed circuit board of another prescribed thickness in accordance with certain principles of the invention.

The insert track 152, as illustrated in FIG. 22, includes a body portion 155 which is formed with a plurality of spaced snap-insert projections 156 extending from the underside of the track. The spacing between the projections 156 coincides with the spacing between the through holes 153 of the shelf 46. Each projection 156 is formed with structure to prmit the projections to be snap-inserted into the through holes. An L-shaped member, designated generally by the numeral 157, having a foot 158 spaced from and parallel to the finger 157 is also formed on the underside of the insert track 152. A guide passageway 159 is formed in the top surface of the insert track 152 and is provided with a flared entry end 161. The width of the insert track 152 is slightly less than the width of the guide passageway 49 and is designed to fit snugly between the rows of tabs 48a and 48b of each guide passageway 49. The width of the guide passageway 159 is slightly larger than the thickness of the unsupported printed wiring board, such thickness being referred to above as the lesser prescribed thickness.

In assembling the insert track 152 with the shelf 46, the body 155 of the insert track 152 is positioned so that the flared entry end 161 is angled downwardly. The L-shaped member 157 is then inserted into and through the offset front slot 154 of the shelf 46. The insert track 152 is then moved slightly toward the front 51 of the shelf 46 so that the foot 158 of the L-shaped member 157 is located adjacent to the underside of the shelf portion 47 immediately forward of the offset front slot 154. At this point, the snap-insert projections 156 are positioned over the associated through holes 153 of the shelf 46. The body 155 of the insert track 152 is then lowered to snap insert the projections into the through holes 153. The insert track 152 is now securely assembled with the shelf 46 and provides the guide passageway 159 for receiving the lower edge of a circuit plug-in unit, such as an unsupported printed wiring board, of the lesser prescribed thickness.

In order to completely accommodate a circuit plug-in unit of the lesser prescribed thickness, the underside of the shelf 46 must also be provided with facility to receive the upper edge of such circuit plug-in unit.

Figure 23:
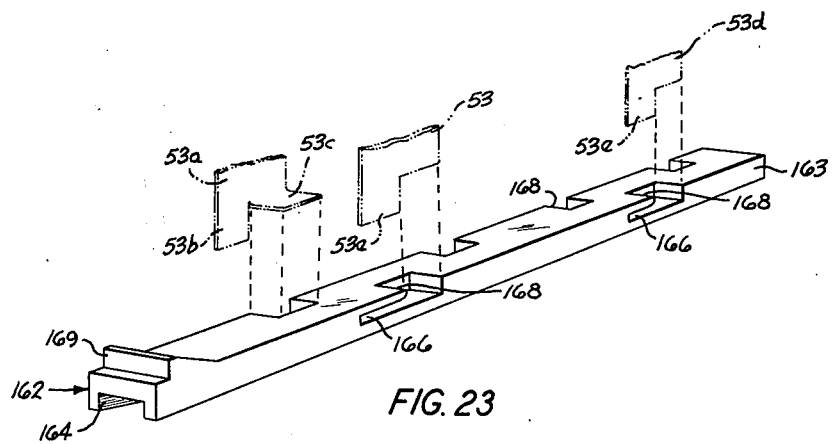
FIG. 23 is a perspective view of a plastic track insert to be assembled with another edge of the printed circuit board of another prescribed thickness.

Referring now to FIG. 23, there is illustrated another plastic insert track designated generally by the numeral 162. The insert track 162 includes a body 163 having a guide passageway 164 formed in the underside thereof. Only the entry end of the guide passageway 164 is visible in FIG. 23. However, the guide passageway is identical in detail to the guide passageway 159 (FIG. 22) of the insert track 152.

A plurality of deep slots 166 are formed at spaced locations in side walls 167 (one shown) of the body 163. A plurality of wide slots 168 are formed in the top of the body 163. Each wide slot 168 communicates with the rear portion of an associated one of the deep slots 166. The front-to-back dimension of each slot 168 is slightly larger than the width dimension of the ears 53c and 53f (FIG. 4) of the tabs 53 formed on the underside of the shelf 46. In addition, the top-to-bottom dimension of each slot 166 is slightly larger than the thickness of the ears 53c and 53f.

A locking ramp 169 is formed on the top surface of the insert track 162 adjacent to the front end thereof. The ramp 169 tapers toward the rear of the insert track 162 and is spaced from the front end of the insert track by a distance equal to the thickness of the metal from which the shelf 46 was formed. Additionally, the width of the insert track 162 is slightly less than the width of the notches 55 (FIG. 3) formed in the front 51 of the shelf 46.

In assembling the insert track 162 with the shelf 46, the track is positioned beneath the shelf so that the slots 168 are aligned with associated ones of the ears 53c and 53f of one guide passageway 54. The insert track 162 is then moved upwardly to pass the slots 168 over the associated ears 53c and 53f and to seat the ears in the rear portion of the associated slots 168. As the insert track 162 is moved upwardly, a portion of the track to the rear of the locking ramp 169 is inserted into the notch 55 of the guide passageway 54. After the ears 53c and 53f are seated in the rear portion of the slots 166, the insert track 162 is moved rearwardly so that the ears are moved, relatively, into the forward covered portion of the slots 166. In addition, the locking ramp 169 is moved over and snaps behind the metal portion of the shelf 46 which is above the notch 55. Thus, with the ears 53c and 53f secured within the slots 166 and the locking ramp 169 positioned above and behind the notch 55, the insert track 162 is secured with the self 46 and provides the guide passageway 164 for the upper edge of a circuit plug-in unit having the lesser prescribed thickness.

Thus, the shelf 46 and back plate 64, and the various structural attachments which can be assembled therewith, provide a versatile structure for supporting circuit plug-in units in assembly with prewired connectors. The versatility of such structure permits the assembly of circuit plug-in units of different prescribed thicknesses and different depth dimensions to be assembled while only requiring the manufacture of a single size of the shelf 46 and the back plate 64. In addition, the structure of the back plate 64 permits the economical prewired connectorization of connectors 37 assembled therewith and the avoiding of the use of costly wiring techniques. Further, the structure of the back plate 64 facilitates the retaining of wires 74 in desired routing.

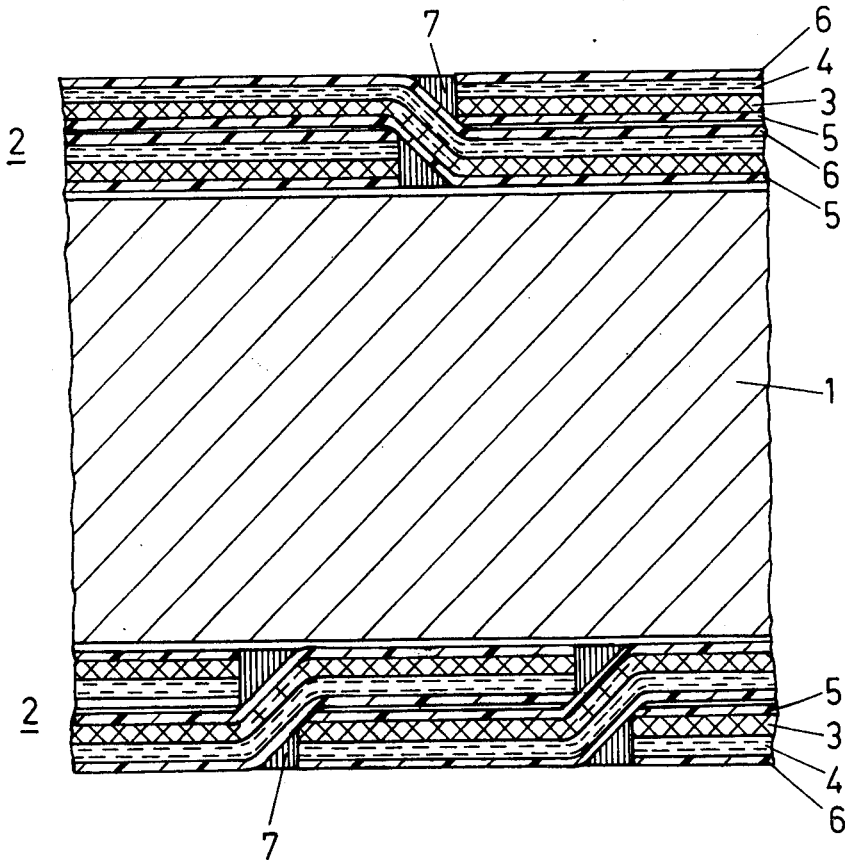

What is claimed is:

1. A structure for providing support for a plurality of circuit plug-in units, a corresponding plurality of connectors and associated wires, which comprises:
    means for supporting in a prescribed array a plurality of the circuit plug-in units of a prescribed depth dimension and a prescribed thickness dimension;
    means, independent of the circuit plug-in unit supporting means, for receiving a plurality of the connectors in a prescribed array corresponding to the prescribed array of the supporting of the circuit plug-in units;
    bendable means, formed integrally with the connector receiving means, for enclosing portions of each of the plurality of connectors to secure the connectors with the connector receiving means in the prescribed array;
    means for fastening the circuit plug-in unit supporting means with the connector receiving means;
    frame means for supporting the circuit plug-in unit supporting means with the connector receiving means in the prescribed array;
    means, formed integrally with the circuit plug-in unit supporting means, for securing the circuit plug-in unit supporting means to the frame means;
    at least one wire passageway opening formed in the connector receiving means to permit the routing of the associated wires from the connector receiving means to areas external thereof; and
    means, in movable assembly with the connector receiving means at the wire passageway opening, for providing a lateral opening to the passageway opening to permit the placing of the associated wires therein and for selectively closing the lateral opening to retain the associated wires in the passageway opening.

2. The structure as set forth in claim 1, which further comprises:
    means, detachably preassembled with the connector receiving means, for securing the connector receiving means to the frame means.

3. The structure as set forth in claim 1, which further comprises:
    means, detachably assembled at spaced portions thereof with the circuit plug-in unit supporting means and the connector receiving means, for holding the connector receiving means in rigid supported assembly with the circuit plug-in unit supporting means.

4. The structure as set forth in claim 1, which further comprises:
    means, formed in the circuit plug-in unit supporting means and the connector receiving means, for aligning the circuit plug-in unit supporting means and the connector receiving means so that the prescribed arrays of the circuit plug-in units and the connectors are aligned.

5. The structure as set forth in claim 1, which further comprises:
    a protective cover for assembly with the connector receiving means to shield wire connections to the connectors; and
    means formed in the connector receiving means for supporting the protective cover.

6. The structure as set forth in claim 1, which further comprises:
    means, detachably securable between the circuit plug-in unit supporting means and the connector receiving means, for mounting the circuit plug-in unit supporting means and the connector receiving means in a spaced relationship to support circuit plug-in units of a depth dimension greater than the prescribed depth dimension.

7. The structure as set forth in claim 1, which further comprises:
    means, detachably securable with the circuit supporting means, for supporting in the prescribed array a plurality of circuit plug-in units having a thickness dimension less than the prescribed thickness dimension.

8. The structure as set forth in claim 1, which further comprises:
    means detachably securable with the connector receiving means, for retaining the associated wires in a grouped arrangement on the connector receiving means; and
    means, formed in the connector receiving means, for receiving portions of the retaining means.

9. The structure as set forth in claim 1, which further comprises:
    means, detachably securable with the connector receiving means, for securing a connector plug to the connector receiving means, the connector plug being wirable to the connector; and

United States Patent [19]

Schuler

[11] 4,038,741
[45] Aug. 2, 1977

[54] METHOD OF MAKING ELECTRICAL COILS FOR DYNAMO-ELECTRIC MACHINES HAVING BAND-FORMED INSULATION MATERIAL

[75] Inventor: Roland Schuler, Wettingen, Switzerland

[73] Assignee: BBC Brown Boveri & Company Limited, Baden, Switzerland

[21] Appl. No.: 648,801

[22] Filed: Jan. 13, 1976

Related U.S. Application Data

[62] Division of Ser. No. 467,836, May 7, 1974, abandoned.

[30] Foreign Application Priority Data

May 17, 1973 Switzerland .................................. 6962

[51] Int. Cl.² ...................... H02K 15/04; H01F 41/12
[52] U.S. Cl. ........................................ 29/596; 29/605; 174/120 SR; 174/121 SR; 310/208; 310/213
[58] Field of Search .................. 29/596, 605; 310/208, 310/213; 174/120 SR, 121 SR; 156/53

[56] References Cited

U.S. PATENT DOCUMENTS

| 2,656,290 | 10/1953 | Berberich et al. | 29/596 X |
| 2,707,204 | 4/1955 | Richardson et al. | 29/596 X |
| 2,917,570 | 12/1959 | Wolff et al. | 174/120 SR |
| 3,556,925 | 1/1971 | Mertens | 29/596 X |
| 3,695,984 | 10/1972 | Rogers, Jr. | 174/120 SR X |

*Primary Examiner*—Carl E. Hall
*Attorney, Agent, or Firm*—Pierce, Scheffler & Parker

[57] ABSTRACT

A composite tape insulation for use in winding onto electrical conductors to be further processed for installation in an electrical machine comprises an internal insulation structure having a layer of glass cloth or polyester fleece and a layer of fine mica impregnated with a cured synthetic resin such as an epoxide resin, and outer facing layers of a synthetic material such as a polycarbonate resin bonded to opposite sides of the internal insulation structure by the impregnating resin. The composite tape insulation is made by passing the internal layer structure through a bath of the impregnating resin, thereafter applying the outer facing layers, heating the resulting composite structure so as to cure the impregnating resin to an intermediate B state, winding the composite structure onto the bare electrical conductor with an overlap of the order of 50%, cutting the conductor into lengths which are then shaped to the desired configuration, and then final pressing and heating the insulated and shaped conductor lengths to establish a final bond of all components and conversion of the impregnating resin to its C state.

6 Claims, 2 Drawing Figures